(12) United States Patent
Wang et al.

(10) Patent No.: US 8,044,651 B2
(45) Date of Patent: Oct. 25, 2011

(54) EFFICIENT PWM CONTROLLER

(75) Inventors: Yen-Hui Wang, Hsin-Chu (TW);
Chin-Yen Lin, Hsin-Chu (TW);
Chia-Chieh Hung, Hsin-Chu (TW);
Yu-Min Shih, Hsin-Chu (TW)

(73) Assignee: Grenergy Opto., Inc., Hsin-Chu (TW)

( * ) Notice: Subject to any disclaimer, the term of this patent is extended or adjusted under 35 U.S.C. 154(b) by 527 days.

(21) Appl. No.: 12/331,529

(22) Filed: Dec. 10, 2008

(65) Prior Publication Data

US 2010/0141033 A1 Jun. 10, 2010

(51) Int. Cl.
*G05F 1/40* (2006.01)
(52) U.S. Cl. ........................................ 323/288; 327/132
(58) Field of Classification Search .......... 323/282–288; 327/131, 132, 134, 137
See application file for complete search history.

(56) References Cited

U.S. PATENT DOCUMENTS

| 5,760,623 | A  | * | 6/1998 | Hastings | 327/137 |
| 6,519,165 | B2 | * | 2/2003 | Koike | 363/21.12 |
| 7,106,130 | B2 | * | 9/2006 | Gan et al. | 330/10 |
| 7,800,352 | B2 | * | 9/2010 | Qiu et al. | 323/284 |
| 7,928,715 | B2 | * | 4/2011 | Shibata | 323/288 |

* cited by examiner

*Primary Examiner* — Jessica Han
(74) *Attorney, Agent, or Firm* — Ming Chow; Sinorica, LLC

(57) ABSTRACT

This patent discloses an efficient PWM controller for generating a pulse signal in response to a feedback signal, capable of operating in a normal mode or a green mode, comprising: a capacitor for building a saw-tooth signal by current integration, the saw-tooth signal having a ramp-up period and a ramp-down period; a first composite current source for the ramp-up period, detachable into a first constant current source and a first variable current source; and a second composite current source for the ramp-down period, detachable into a second constant current source and a second variable current source; wherein, the first variable current source is attached to the first constant current source and the second variable current source is attached to the second constant current source respectively in the green mode.

8 Claims, 7 Drawing Sheets

EFFICIENT PWM CONTROLLER

BACKGROUND OF THE INVENTION

1. Field of the Invention

The present invention relates to a PWM (Pulse Width Modulation) controller, and more particularly to a PWM controller capable of performing power management in power conversion applications.

2. Description of the Related Art

To describe the related art of the present invention, the relation between a PWM controller and a power conversion application shall be introduced first. Please refer to FIG. 1, which shows the architecture of a typical application of PWM controller. As shown in FIG. 1, the architecture realizing a fly-back type power converter, at least includes: a PWM controller 100, an input rectifier and filter 101, a main transformer 102, an output rectifier and filter 103, a feedback network 104, and an NMOS transistor 105.

In the architecture, the PWM controller 100 is used for generating a pulse signal $S_P$ in response to a feedback signal $V_{FB}$.

The input rectifier and filter 101 is used for generating a first DC voltage according to an AC input power source.

The main transformer 102 and the output rectifier and filter 103 are used to transfer the first DC voltage to a DC output voltage $V_O$.

The feedback network 104 is used to generate the feedback signal $V_{FB}$ according to the DC output voltage $V_O$.

The NMOS transistor 105 is used to control the power transformation through the main transformer 102 in response to the pulse signal $S_P$.

Through a periodic on-and-off switching of the NMOS transistor 105, which is driven by the pulse signal $S_P$ generated from the PWM controller 100, the input power is transformed through the main transformer 102 to the output. The operating principle of the PWM controller 100 is to be illustrated according to FIG. 2, which shows the circuit diagram of a prior art PWM controller. As shown in FIG. 2, the prior art PWM controller at least includes: a saw-tooth signal generator 200, a trigger generator 201, a latch 202, a NOT gate 203, a NOT gate 204, a reset generator 205 and an output stage 206.

In the circuit, the saw-tooth signal generator 200 is used for generating a saw-tooth signal $V_{SAW}$ in response to an ICKB signal and an ICK signal, and comprises a current source $I_{UP}$, a switch $SW_{UP}$, a capacitor $C_T$, a switch $SW_{DN}$ and a current source $I_{DN}$. When the switch $SW_{UP}$ is on, the current source $I_{UP}$ flowing into the capacitor $C_T$ will cause the saw-tooth signal $V_{SAW}$ to ramp up; when the switch $SW_{DN}$ is on, the current source $I_{DN}$ flowing out from the capacitor $C_T$ will cause the saw-tooth signal $V_{SAW}$ to ramp down.

The trigger generator 201 is used to generate a pair of trigger signals for the latch 202 according to the comparisons of the saw-tooth signal $V_{SAW}$ to a level $V_H$ and a level $V_L$.

The latch 202 is used for generating a CKB signal and a CK signal according to the pair of trigger signals, in which the CKB signal is a complement to the CK signal.

The NOT gate 203 is used to generate the ICKB signal according to the CKB signal; the NOT gate 204 is used to generate the ICK signal according to the CK signal.

The reset generator 205 is used for generating a RESET signal according to a ramp signal $V_S$ and a $V_+$ signal which is derived from the feedback signal $V_{FB}$. When the RESET signal is at low logic level, the pulse signal $S_P$ of the output stage 206 will be pulled down to low logic level and the NMOS transistor 105 (shown in FIG. 1) will therefore be turned off.

The output stage 206 is used to generate the pulse signal $S_P$ in response to the CK signal and the RESET signal. The timing relation among the saw-tooth signal $V_{SAW}$, CKB signal, $V_+$ signal, ramp signal $V_S$ and pulse signal $S_P$ is shown in FIG. 3. As shown in FIG. 3, the ramp-up period and the ramp down period are fixed, so the period of the pulse signal $S_P$ is fixed. In this case, the NMOS transistor 105 (shown in FIG. 1) will be switched at a fixed frequency regardless the loading condition of the fly-back type power converter. However, if the loading condition is in light load or in empty load, this design will waste much power and surely does not comply with the energy-saving requirement.

Therefore, there is a demand to provide an efficient PWM controller with adjustable output pulse frequency that can offer flexibility in selecting the pulse frequency according to the loading condition, to manage the power consumption of a power conversion application.

SUMMARY OF THE INVENTION

In view of the description above, an objective of the present invention is to provide a PWM controller having an efficient way of power management that can reduce the power consumption of a power conversion application when the loading is in light load or empty load.

A still another objective of the present invention is to further provide an efficient PWM controller capable of operating in a first mode or a second mode according to a mode selecting signal.

A still another objective of the present invention is to further provide an efficient PWM controller comprising a saw-tooth signal generator for generating a first saw-tooth signal of the first mode or a second saw-tooth signal of the second mode, wherein the first saw-tooth signal comprises a first ramp-up period and a first ramp-down period, and the second saw-tooth signal comprises a second ramp-up period and a second ramp-down period.

The present novel means of saw-tooth signal generation, providing a first saw-tooth signal of the first mode or a second saw-tooth signal of the second mode, can be utilized in a PWM controller to reduce the power consumption of related power conversion applications when the loading is in light load or empty load. The power conversion applications can be AC/DC, DC/DC, AC/AC or DC/AC.

An efficient PWM controller is proposed for performing power management in power conversion applications. The efficient PWM controller capable of operating in the first mode, for example but not limited to a normal mode, or in the second mode, for example but not limited to a green mode, comprises a saw-tooth signal generator for generating a first saw-tooth signal of the normal mode or a second saw-tooth signal of the green mode, in response to a mode selecting signal. The first saw-tooth signal includes a first ramp-up period and a first ramp-down period; the second saw-tooth signal includes a second ramp-up period and a second ramp-down period; the second ramp-up period is longer than the first ramp-up period, and the second ramp-down period is longer than the first ramp-down period.

In the saw-tooth signal generator, the first ramp-up period plus the first ramp-down period results in a first switching period, and the second ramp-up period plus the second ramp-down period results in a second switching period. The second switching period corresponding to the green mode, as shown in FIG. 4, is longer than the first switching period corresponding to the normal mode due to the design that the second ramp-up period is longer than the first ramp-up period, and the second ramp-down period is longer than the first ramp-down period.

To make it easier for our examiner to understand the objective of the invention, its structure, innovative features, and performance, we use a preferred embodiment together with the attached drawings for the detailed description of the invention.

DETAILED DESCRIPTION OF THE PREFERRED EMBODIMENTS

The present invention will be described in more detail hereinafter with reference to the accompanying drawings that show the preferred embodiments of the invention.

In a switching circuit comprising energy-storing elements such as inductors, capacitors, etc., the dynamic power consumption of the switching circuit due to the energy-storing elements will be increased as the switching frequency goes up. For example, the formula of dynamic power consumption of a capacitor $C_T$ is $P_d = C_T * f_s * V_{DD}^2$, in which $f_s$ is the switching frequency, $V_{DD}$ is the maximum voltage across the capacitor, and the power consumption $P_d$ is proportional to the switching frequency $f_s$. In a power conversion application, the switching frequency designed for the normal load is much higher than that needed for the light load or empty load. As a result, the prior art PWM controller with fixed switching period regardless the loading condition will consume a lot of unnecessary power when operating in light load or empty load. The present invention grasps this point and offers a solution which will be disclosed in the following description.

Figure 1:
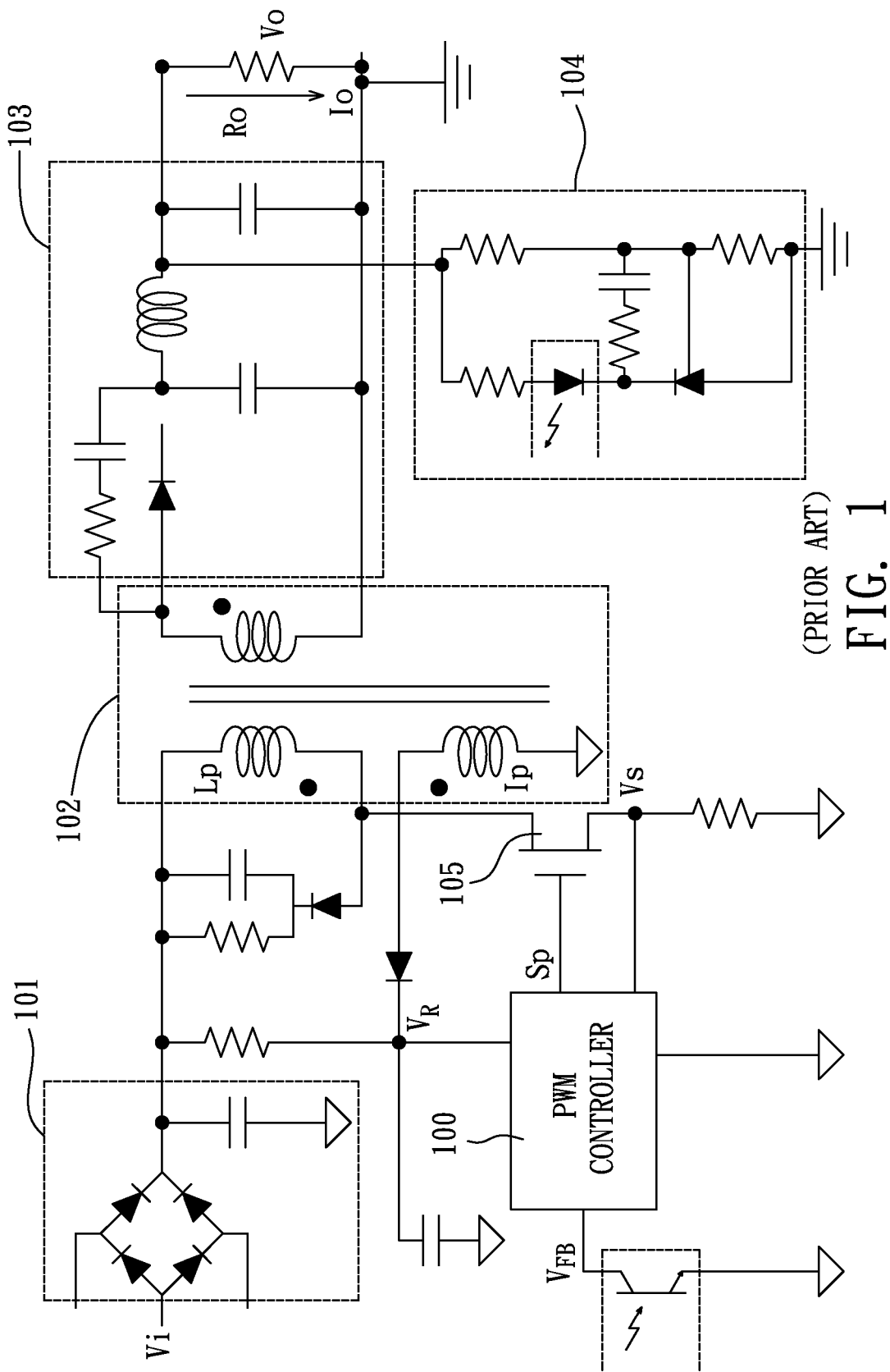
FIG. 1 is the architecture of a typical application of PWM controller.
Figure 2:
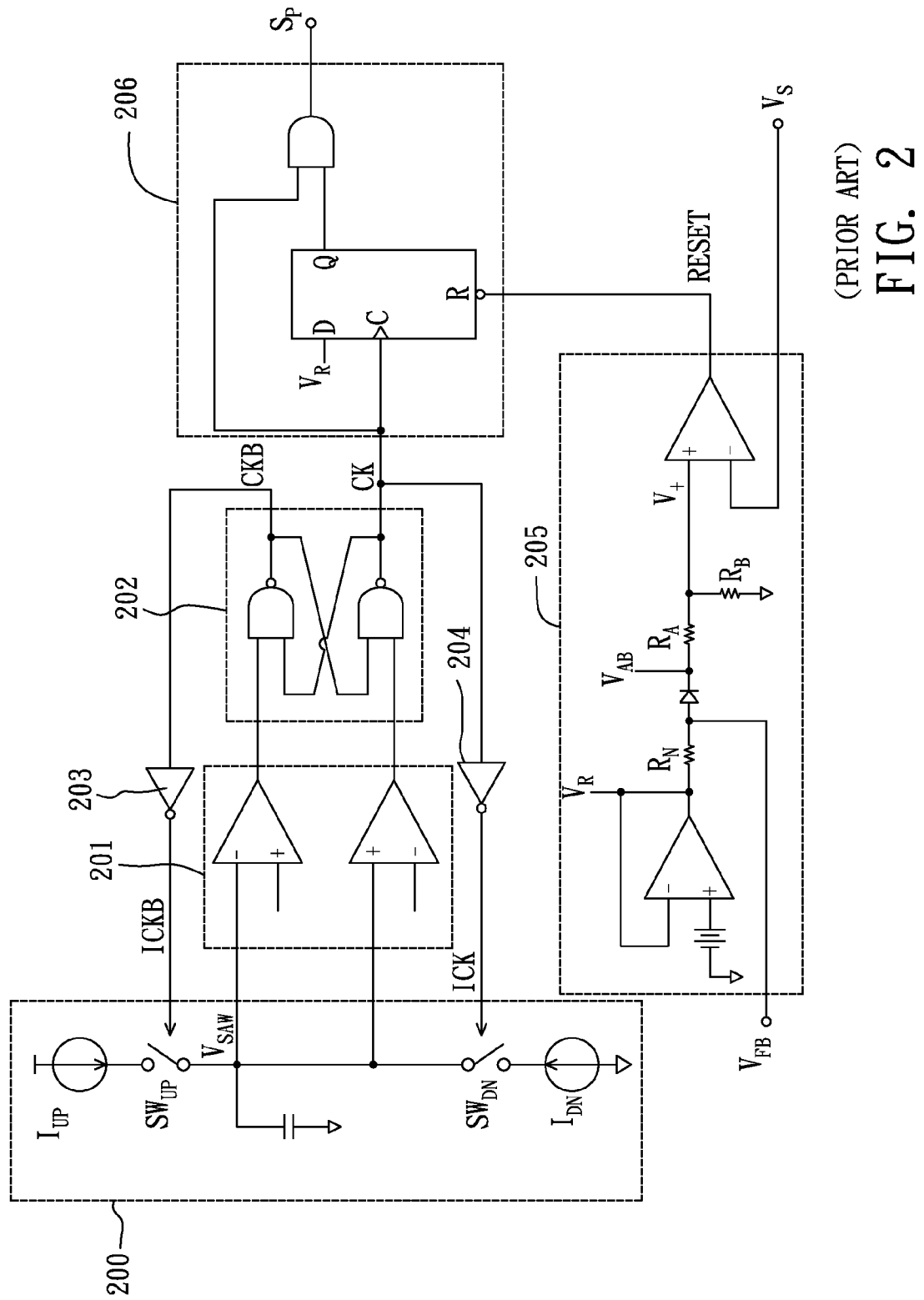
FIG. 2 is a circuit diagram of a prior art PWM controller.
Figure 3:
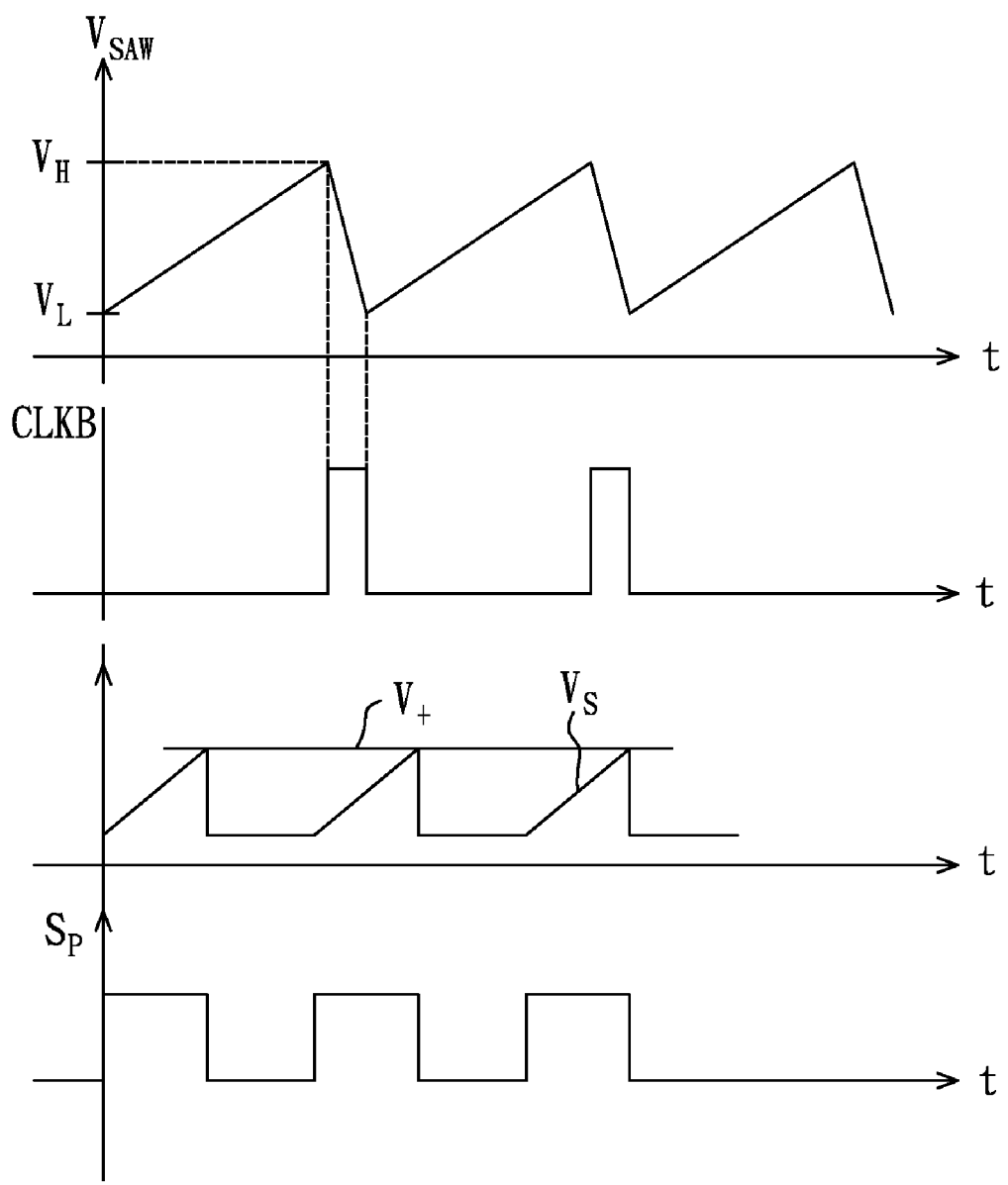
FIG. 3 is a wave-form diagram for major signals in a prior art PWM controller.
Figure 4:
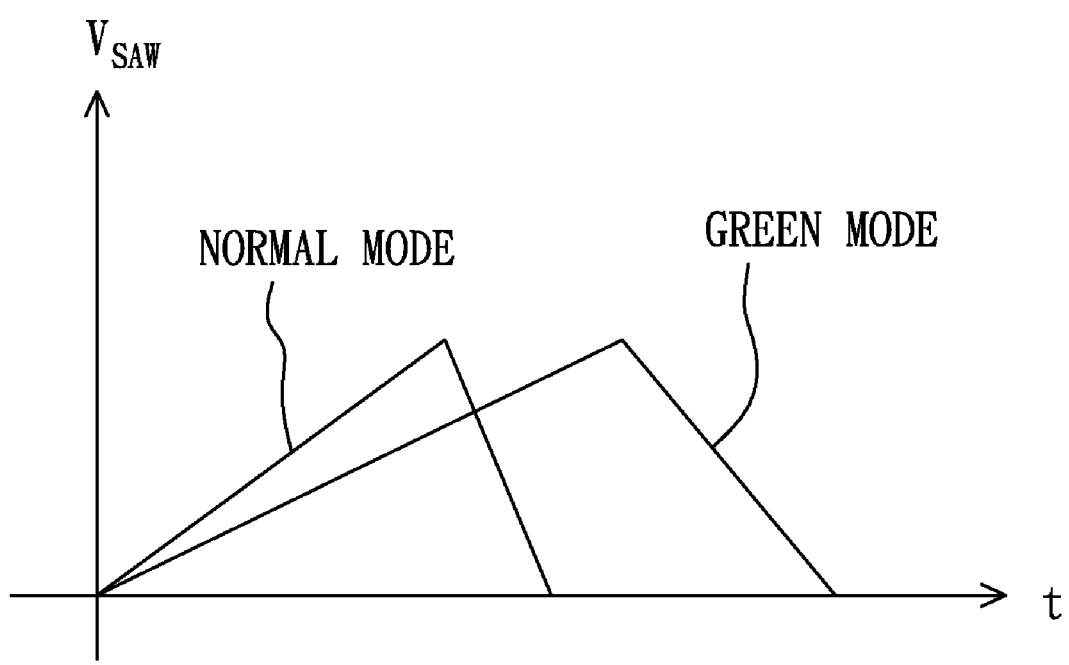
FIG. 4 shows the wave-form of one ramp-up period plus one ramp-down period of saw-tooth signals in the normal mode as well as in the green mode for a preferred embodiment of the present invention.
Figure 5:
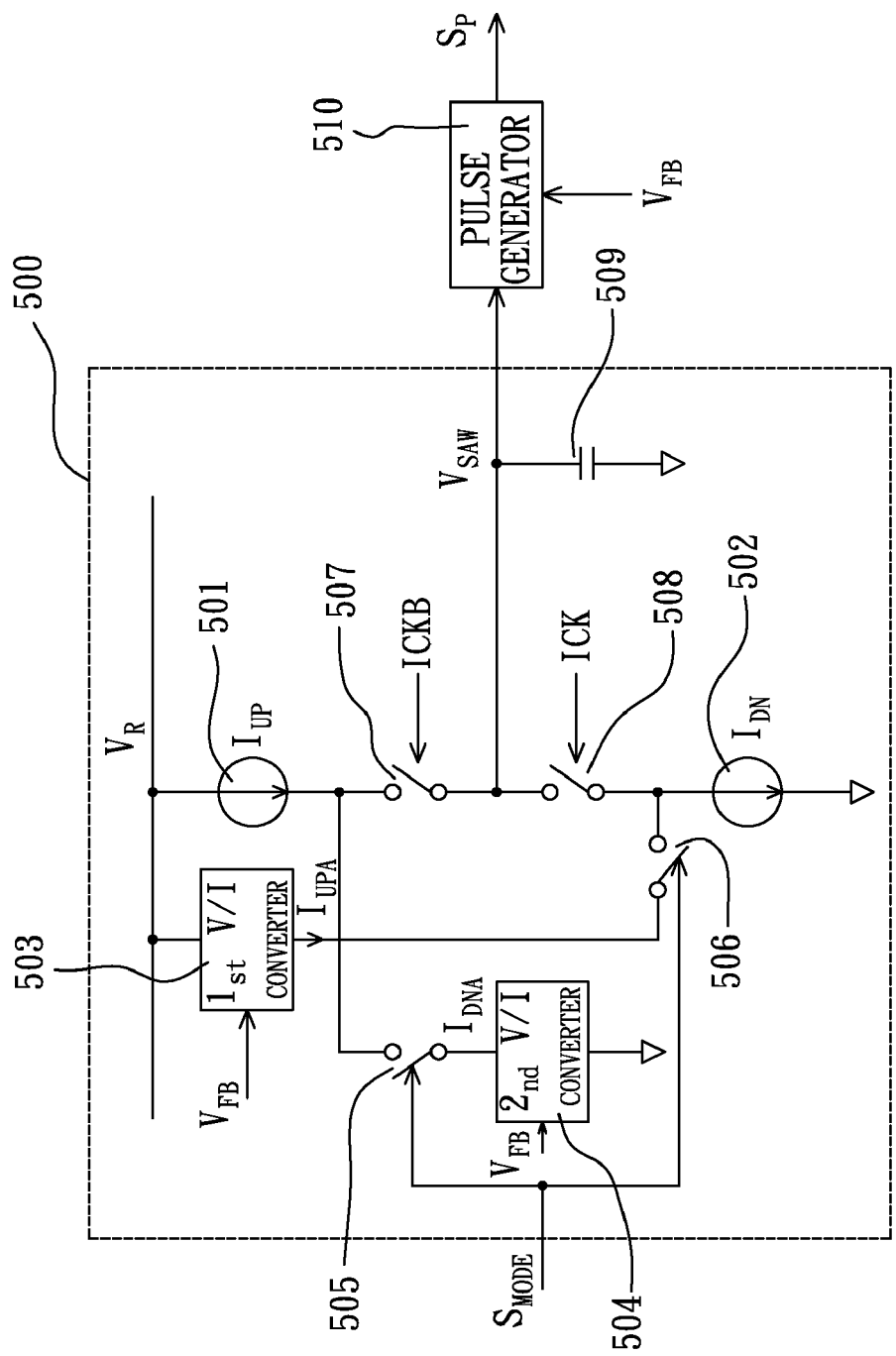
FIG. 5 is a block diagram of PWM controller of a preferred embodiment of the present invention.

Please refer to FIG. 5, which shows a block diagram of PWM controller of a preferred embodiment of the present invention. As shown in FIG. 5, the PWM controller includes a saw-tooth signal generator 500 and a pulse generator 510.

In the PWM controller, the saw-tooth signal generator 500 is used for generating a corresponding saw-tooth signal $V_{SAW}$ in response to a mode selecting signal $S_{MODE}$, and comprises: a constant current source 501, a constant current source 502, a voltage to current converter 503, a voltage to current converter 504, a switch 505, a switch 506, a switch 507, a switch 508 and a capacitor 509.

The constant current source 501 is used to generate a constant current $I_{UP}$.

The constant current source 502 is used to generate a constant current $I_{DN}$.

The voltage to current converter 503 is used to generate a current $I_{UPA}$ in response to a feedback voltage $V_{FB}$.

The voltage to current converter 504 is used to generate a current $I_{DNA}$ in response to a feedback voltage $V_{FB}$.

The switch 505 is used to connect the constant current source 501 with the voltage to current converter 504 in response to the mode selecting signal $S_{MODE}$. When $S_{MODE}$ indicates the normal mode, the switch 505 is off; when $S_{MODE}$ indicates the green mode, the switch 505 is on.

The switch 506 is used to connect the constant current source 502 with the voltage to current converter 503 in response to the mode selecting signal $S_{MODE}$. When $S_{MODE}$ indicates the normal mode, the switch 506 is off; when $S_{MODE}$ indicates the green mode, the switch 506 is on.

The switch 507 is used to connect the constant current source 501 with the capacitor 509 in response to the ICKB signal.

The switch 508 is used to connect the constant current source 502 with the capacitor 509 in response to the ICK signal.

The capacitor 509 is used to build the saw-tooth signal $V_{SAW}$ by current integration.

The pulse generator 510 is used to generate the pulse signal $S_P$ in response to the saw-tooth signal $V_{SAW}$ and the feedback voltage $V_{FB}$.

In FIG. 5, the voltage to current converter 503 generates the current $I_{UPA}$ according to a first function of the feedback voltage $V_{FB}$, and the voltage to current converter 504 generates the current $I_{DNA}$ according to a second function of the feedback voltage $V_{FB}$. The current $I_{UPA}$ is smaller than the current $I_{DN}$ and the current $I_{DNA}$ is smaller than the current $I_{UP}$, and the first function and second function are preferably first order polynomials of the feedback voltage $V_{FB}$.

Figure 6:
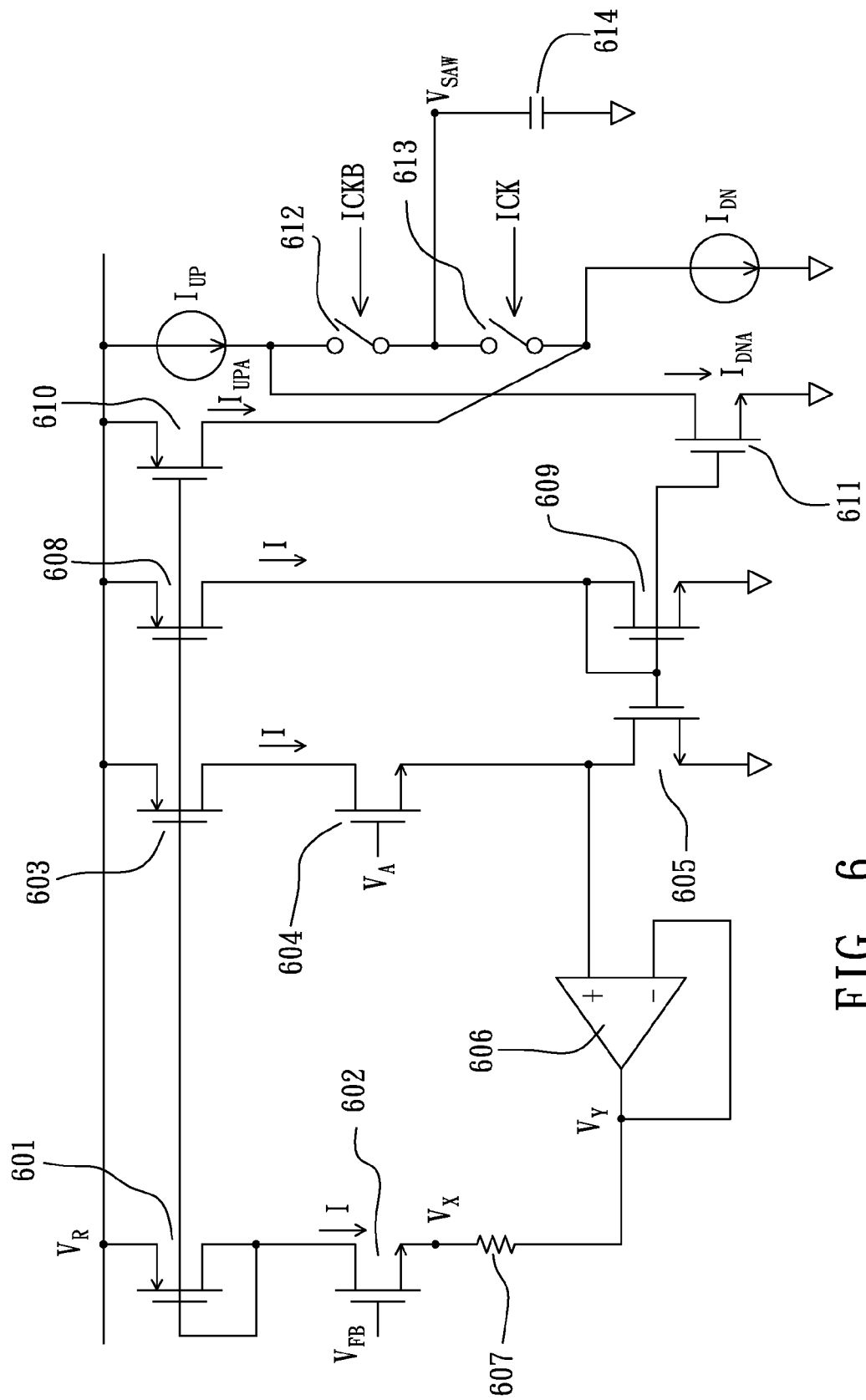
FIG. 6 is a circuit diagram of a saw-tooth generator operating in the green mode for the PWM controller of a preferred embodiment of the present invention.

Please refer to FIG. 6, which shows a circuit diagram of a saw-tooth generator operating in the green mode for the PWM controller of a preferred embodiment of the present invention. As shown in FIG. 6, the saw-tooth signal generator includes: a PMOS transistor 601, an NMOS transistor 602, a PMOS transistor 603, an NMOS transistor 604, an NMOS transistor 605, an OPA 606, a resistor 607, a PMOS transistor 608, an NMOS transistor 609, a PMOS transistor 610, an NMOS transistor 611, a switch 612, a switch 613 and a capacitor 614.

In the circuit, the PMOS transistor 601 is used to duplicate the current I to other branches.

The NMOS transistor 602 is used to generate voltage $V_X = V_{FB} - V_{GS}$.

The PMOS transistor 603 is used to mirror the current I from the PMOS transistor 601.

The NMOS transistor 604 is used to generate voltage $V_Y = V_A - V_{GS}$.

The NMOS transistor 605 is used to provide the current path for current I.

The OPA 606 is used as a unit-gain buffer.

The resistor 607 having resistance R is used to generate the current $I = (V_X - V_Y)/R$.

The PMOS transistor 608 is used to mirror the current I from the PMOS transistor 601.

The NMOS transistor 609 is used to duplicate the current I to other branches.

The PMOS transistor 610 is used to generate the current $I_{UPA}$ according to the current I.

The NMOS transistor 611 is used to generate the current $I_{DNA}$ according to the current I.

The roles of switch 612, switch 613 and capacitor 614 are the same with those of the switch 507, switch 508 and capacitor 509 described in FIG. 5.

In the above preferred embodiment, both the first function and second function can still be of other forms, for example but not limited to constant function. In the case of constant function, the green mode switching period which is longer than the normal mode switching period is kept constant.

Figure 7:
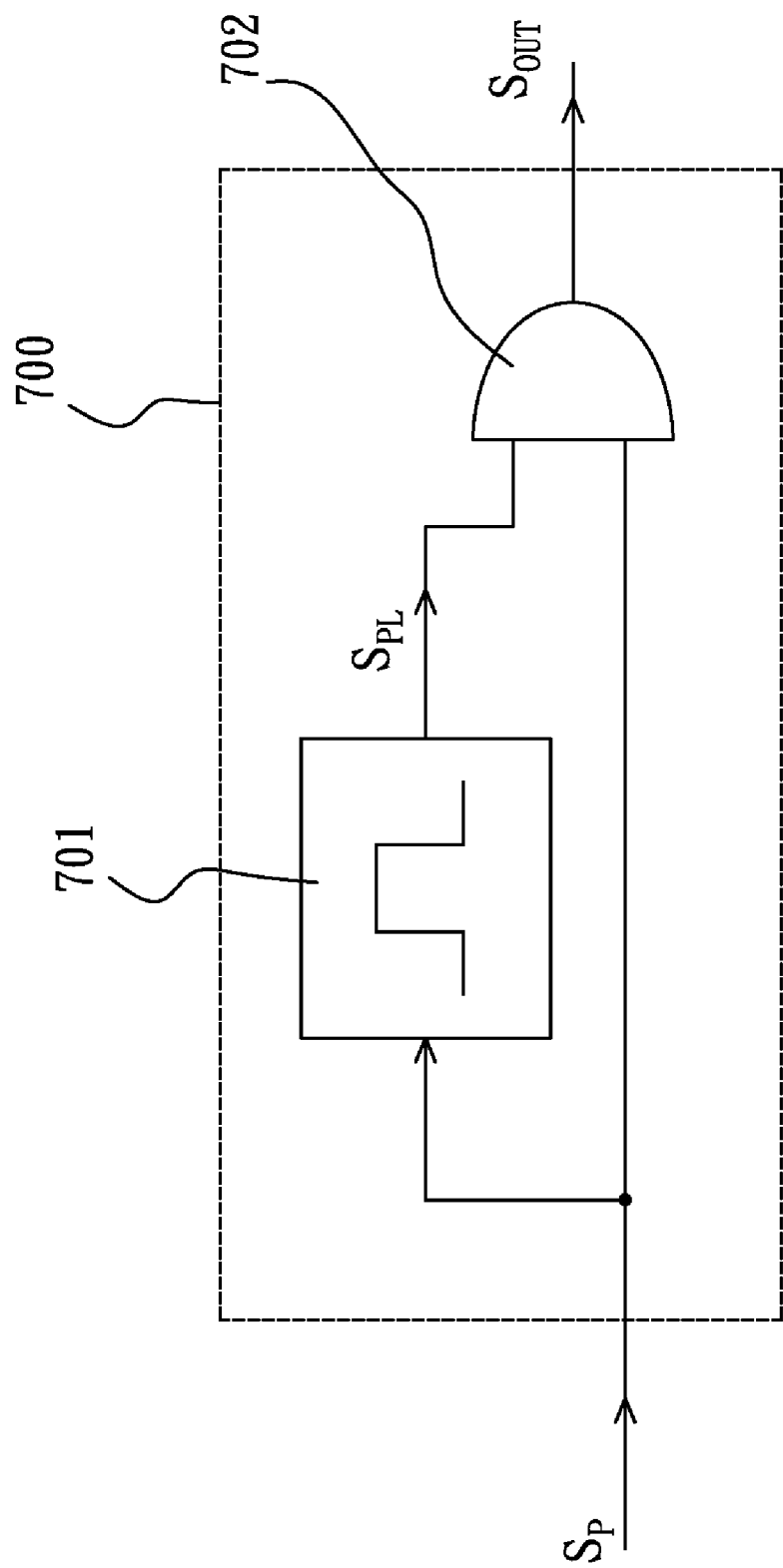
FIG. 7 is a block diagram of a pulse width limiter of a preferred embodiment of the present invention.

Besides, in the power conversion applications comprising a transformer, when the ramp-up period in the green mode is too long, the transformer may be saturated. In this case, some pulse width limiting measure can be further included in the PWM controller of a preferred embodiment of the present invention. Please refer to FIG. 7, which shows a block diagram of a pulse width limiter 700. As shown in FIG. 7, the pulse width limiter 700 includes a one-shot pulse generator 701 and an AND gate 702.

The one-shot pulse generator 701 is used to generate a single pulse $S_{PL}$ of a fixed pulse width in response to the pulse signal $S_P$.

The AND gate 702 is used to generate an output signal $S_{OUT}$ in response to the single pulse $S_{PL}$ and the pulse signal $S_P$. Through a proper setting of the fixed pulse width, the transformer in the power conversion applications can be free of saturation for sure.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. An efficient PWM controller capable of providing a first switching period or
a second switching period, comprising:
   a capacitor for building a saw-tooth signal by current integration, said saw-tooth signal having a ramp-up period and a ramp-down period;
   a first composite current source for supplying a first ramp-up current or a second ramp-up current; and
   a second composite current source for supplying a first ramp-down current or a second ramp-down current;
   wherein, said first ramp-up current and said first ramp-down current are used in generating said first switching period; said second ramp-up current and said second ramp-down current are used in generating said second switching period.

2. The efficient PWM controller as recited in claim 1, wherein said first ramp-up current is greater than said second ramp-up current and said first ramp-down current is greater than said second ramp-down current.

3. The efficient PWM controller as recited in claim 2, wherein said second ramp-up current and said second ramp-down current are constant.

4. The efficient PWM controller as recited in claim 2, wherein said second ramp-up current is determined according to a first function of a feedback signal and said second ramp-down current is determined according to a second function of said feedback signal.

5. The efficient PWM controller as recited in claim 4, wherein said first function and second function are first order polynomials of said feedback signal.

6. The efficient PWM controller as recited in claim 5, further comprising a pulse generator for generating a pulse signal in response to said saw-tooth signal and feedback signal.

7. The efficient PWM controller as recited in claim 6, further comprising a limiting unit which comprises a one-shot pulse generator and an AND gate and is used to limit the pulse width of said pulse signal.

8. An efficient PWM controller capable of operating in a first mode or a second mode according to a mode selecting signal, comprising a saw-tooth signal generator for generating a first saw-tooth signal of said first mode or a second saw-tooth signal of said second mode, wherein said first saw-tooth signal comprises a first ramp-up period and a first ramp-down period, and said second saw-tooth signal comprises a second ramp-up period and a second ramp-down period, and said second ramp-up period is longer than said first ramp-up period, and said second ramp-down period is longer than said first ramp-down period.

* * * * *